(12) United States Patent
Vukovic (10) Patent No.: US 7,691,243 B2
(45) Date of Patent: Apr. 6, 2010

(54) INTERNAL ANTENNAE FOR PLASMA PROCESSING WITH METAL PLASMA

(75) Inventor: Mirko Vukovic, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 1058 days.

(21) Appl. No.: 10/873,544

(22) Filed: Jun. 22, 2004

(65) Prior Publication Data

US 2005/0279628 A1    Dec. 22, 2005

(51) Int. Cl.
  C25B 9/00 (2006.01)
  C25B 11/00 (2006.01)
  C25B 13/00 (2006.01)
  C23C 14/00 (2006.01)
  C23C 16/00 (2006.01)

(52) U.S. Cl. .............. 204/298.16; 204/298.01; 204/298.17; 118/723 R; 118/723 I (58) Field of Classification Search .............. 118/723 I; 156/345.33, 345.48, 345.49; 204/192.12, 204/192.17, 298.01, 298.16, 298.18; 315/111.21, 315/111.51

See application file for complete search history.

(56) References Cited

U.S. PATENT DOCUMENTS

| | | | | |
|---|---|---|---|---|
| 5,304,279 A * | 4/1994 | Coultas et al. | ......... | 156/345.49 |
| 5,669,975 A * | 9/1997 | Ashtiani | ......... | 118/723 I |
| 5,683,537 A | 11/1997 | Ishii | | |
| 5,900,699 A * | 5/1999 | Samukawa et al. | ..... | 315/111.51 |
| 6,071,372 A * | 6/2000 | Ye et al. | ......... | 156/345.48 |
| 6,097,157 A * | 8/2000 | Overzet et al. | ......... | 315/111.21 |
| 6,123,802 A * | 9/2000 | Donohoe | ......... | 156/345.48 |
| 6,132,566 A * | 10/2000 | Hofmann et al. | ........ | 204/192.17 |
| 6,168,690 B1 * | 1/2001 | Jewett et al. | ........... | 204/192.12 |
| 6,229,264 B1 * | 5/2001 | Ni et al. | ......... | 315/111.51 |
| 6,238,528 B1 * | 5/2001 | Xu et al. | ......... | 204/192.12 |
| 6,245,202 B1 | 6/2001 | Edamura et al. | | |
| 6,269,765 B1 * | 8/2001 | Chu et al. | ......... | 118/723 I |
| 6,287,435 B1 | 9/2001 | Drewery et al. | | |
| 6,719,886 B2 | 4/2004 | Drewery et al. | | |

FOREIGN PATENT DOCUMENTS

| | | |
|---|---|---|
| EP | 0759632 | 2/1997 |
| EP | 0838841 | 4/1998 |
| WO | WO 01/37310 A2 | 5/2001 |

* cited by examiner

Primary Examiner—Jennifer K Michener
Assistant Examiner—Michael Band
(74) Attorney, Agent, or Firm—Wood, Herron & Evans, L.L.P.

(57) ABSTRACT

A plasma processing system and method provide an internal coil in a vacuum chamber for maintaining a high density plasma therein in a manner that may have a less restrictive requirement on metal flux shielding than when the shield protects a dielectric window. The shield also shields the coil from plasma heat load. The coil need not be actively cooled. Some metal is allowed to pass through the shield and deposit on the coil. This leads to a thinner shield with less complicated slots than for shields in external coil configurations. Good RF transparency of the shield is a result of the much simpler shield shape. The coil is not sputtered and is thus not consumable. The coil is enclosed in a small conductive space, reducing its inductance, resulting in reduced coil current and voltage, in turn simplifying the design and construction of the tuning network and RF connectors. Stiffeners support the coil and are profiled to avoid formation of conductive paths forming from metal deposits.

8 Claims, 5 Drawing Sheets

INTERNAL ANTENNAE FOR PLASMA PROCESSING WITH METAL PLASMA

This invention relates to the energizing of high density RF plasmas within the vacuum processing chambers of a plasma processing apparatus, and more particularly, to the use of antennae for coupling of RF energy into plasmas containing metal vapor or metal ions.

BACKGROUND OF THE INVENTION

In the deposition of metal onto semiconductor wafers in semiconductor manufacturing, plasma sources are used, in addition to a primary sputtering plasma source, to improve the performance of the processing tool. For instance, in ionized physical vapor deposition (iPVD) of metal onto a wafer, a supplemental plasma source is often used to increase plasma density to produce an increased fractional ionization of the metal atoms being deposited. This, combined with RF bias on the substrate wafer leads to improved coverage of the features on the wafer surface, and reduces the closing-off of the necks of such features. Likewise during a soft-etch stage that accompanies many iPVD and other processes, an auxiliary plasma source is employed to provide a dense plasma at the wafer level that will maintain a uniform etch at an acceptable rate and at a DC bias voltage level that is low enough to eliminate plasma damage to the wafer. Further, during a pre-clean stage of various processes, it is again desirable to perform a soft-etch of the wafer. As in the case of the soft-etch process, plasma density and uniformity are desired, as is process throughput and reduced plasma damage to the wafer.

In iPVD, the additional plasma source includes an RF antenna, mounted either internally or externally to the process volume. Both antenna locations have advantages and disadvantages. Where a soft-etch process step is executed in an iPVD module, RF power is applied principally to a wafer that is being processed to generate a plasma and provide a DC biasing voltage to the wafer. This method produces a uniform plasma above the wafer, but at high biasing voltages, in excess of 100 V. In such a case, a small inductively coupled plasma (ICP) improves the etch rate and reduces the bias voltage. Often, such a plasma also dramatically reduces the etch uniformity. In pre-cleaning applications, the pre-cleaning process is usually performed in a separate process module. Typically, the source for the plasma for the pre-cleaning includes an external ICP coil, which transmits power into a vacuum chamber through a dielectric window. To prevent the sputtered metal from coating the window, which would reduce RF penetration into the chamber, the window is often protected by a deposition baffle or shield of some complexity.

RF plasma sources for iPVD can use an internal coil design where the coil is immersed in the plasma. Due to high voltages developed on such a coil, the plasma sputters the coil, necessitating coil replacement. To reduce coil voltages and coil sputtering, the coil is typically operated at about 450 kHz. In addition, due to the large plasma thermal load, the coil needs to be water-cooled, complicating coil construction.

An alternative approach to the internal coil in iPVD is the external antenna design, one version of which has been adopted by Drewery et al. in U.S. Pat. No. 6,287,435. In this approach, the RF coil is external to the processing chamber and is situated in air. An RF field from the antenna penetrates into the chamber through a dielectric window. To preserve the transparency of the dielectric window to the RF, the window may be shielded from the metal ions in the plasma in a manner that still provides for RF transparency. This shielding of the window is solved by the introduction of a deposition baffle or shield. The shield is designed to be opaque to the large majority of the metal ions. As discussed in Drewery et al., this is accomplished by introducing a shield of electrically conductive material with long slots generally perpendicular to the direction of the RF antenna conductor segments. This approach removes some of the problems of the internal coil design, but suffers from the drawbacks of deposition shield complexity. The deposition shield must accomplish two counteracting goals: RF transparency and metal opacity. These goals are not easily accomplished, as one is usually achieved at the expense of the other.

The prospect of reduced RF transparency of a dielectric window creates a need to protect the dielectric window from metal deposition. The protection may be provided by a deposition shield, which is either made of one piece with a complex slot shape (such as a chevron) or a two-piece assembly with overlapping slats. Both types of shields introduce transmission losses and result in reduced efficiency of the RF source. The reduced efficiency, and its effect on the output of the whole RF source, can be offset by an increase in coil current, which in turn increases the voltage across the coil. This in turn leads to increased complexity of other parts of the RF circuit, such as the tuning network and RF connectors from the coil to the tuning network.

At iPVD pressures in the range of 30-100 mTorr and higher, an intense plasma having a density in the order of $10^{12}$ $cm^{-3}$ and higher, and electron temperature of 4-5 eV is produced near the RF source. As a result, the shield is subjected to a large thermal load: up to 20 percent or even higher of the RF power is deposited back to the shield in the form of a plasma thermal load. This is particularly the case in deposition applications, for example, in ionized physical vapor deposition (iPVD) applications. These problems are also applicable to soft-etch and pre-clean applications, although these applications usually involve lower power, which simplifies RF power handling and component cooling requirements.

Accordingly, there is a need for an RF power source that overcomes the drawbacks set forth above.

SUMMARY OF THE INVENTION

A primary objective of the present invention is to provide an RF plasma source for iPVD and other processing applications that minimizes the disadvantages of the prior art.

A further object of the invention is to combine the advantages and best features of the different approaches of the prior art that have not previously been available in a single apparatus, and to do so effectively and efficiently.

The principles of the present invention are described below in the context of embodiments of an iPVD process module of the type disclosed in U.S. Pat. Nos. 6,287,435 and 6,719,886 and PCT Application PCT/US00/31756, for example, and to a wafer-level plasma source or a type described in U.S. patent application Ser. No. 10/716,729, filed Nov. 19, 2003, suitable for use, according to the invention, for soft-etch and pre-clean process applications as well as for iPVD.

According to certain embodiments of the invention, a plasma source is provided having one or more of the following features: An internal coil shielded by a plasma shield where the coil and the shield are dimensioned to prevent the ignition of parasitic discharges around the RF coil. An internal coil shielded by a plasma shield where the plasma shield is designed to withstand high temperatures and to absorb most of the plasma heat load, and thereby eliminate the need to actively cool the RF coil. An internal coil behind which a backplate is provided that is RF and thermally grounded, wherein the backplate may be part of the chamber wall, and alternatively and preferably, is a separate removable component. An internal coil and backplate where the coil cross section is such that it reduces metal deposition on the backplate behind the coil. An internal coil where the shape of the RF coil is preserved by stiffeners mounted on the side facing the backplate. Coil stiffeners supporting a coil and including several radial stiffening members made of dielectric material that may be attached to the coil, preferably out of contact with the backplate. Coil stiffeners profiled, on the side facing the plasma, to prevent the formation of a conducting path of deposited material from one turn of the coil to the another. A coil and backplate assembly in which the backplate has grooves machined at locations corresponding to coil stiffening members, to preserve the design spacing of the backplate, preferably of 2 mm or less, from the coil. A coil and plasma shield wherein the shield is configured to absorb most of the plasma heat load and allow a non-negligible fraction of metal flux to deposit on the coil, which simplifies the profile of the shield and increases its RF transparency. Such a shield having several the radial slots for RF transmission. A vacuum seal for the coil RF feed. A coil and backplate assembly in which the center of the coil is thermally and electrically grounded to the backplate. A coil and backplate assembly having an RF feed connected to the outer part of the coil and vacuum seals against the backplate with a two-part sealing assembly.

There are several advantages of the features of the invention that accomplish the objectives of the invention and improve upon the prior art. The backplate can sustain a substantially larger amount of metal deposition than the dielectric window in the external coil configuration. Coil stiffeners keep the coil from sagging and coming into contact with the plasma shield. The backplate supports most of the atmospheric pressure against the vacuum. The advantages of this invention over other iPVD sources include a less restrictive requirement on metal flux shielding. The shield shields the coil from the plasma heat load. Some metal is allowed to pass through the shield and deposit on the coil, allowing a thinner shield with less complicated slots, and good RF transparency. The coil which need not be actively cooled, is not sputtered, and is thus not consumable, but may be cleaned from metal deposition from time to time. Since the coil is enclosed in a small conductive space, its inductance is about 50% less than in typical iPVD sources, resulting in reduced coil voltage, which can be exploited in two ways: 1) by simplifying some of the constraints on the design and construction of the tuning network and RF connectors, or 2) by at least partially trading off the reduced coil voltage for a reduced coil current, for example, by increasing the number of coil turns and thereby reducing the current through the coil. Such a source coil has a much lower profile than a three-dimensional OP coil.

According to other embodiments of the invention, a processing apparatus is equipped with a wafer level plasma source having one or more of the following features. The more useful embodiments of the invention are in iPVD and inductively coupled plasma etch machines. In the wafer level source, the radius of such a source may be larger than in the case of an ICP source in embodiments where the source faces the wafer. Vacuum sealing may not be an issue where the source is completely in vacuum. To prevent the RF feed from striking a plasma, the feed may be enclosed in a dedicated conduit. Parts of the wafer support are typically RF hot, due to the application of RF bias, and a wafer support shield that is typically provided may be either RF hot or RF floating. The source may be grounded separately from the wafer table assembly. Further, the wafer support shield can be RF grounded, or RF hot, or floating.

Depending on the application, some of the features may be more or less important. In exclusively low-pressure applications, the requirements on the spacing of the backplate from the coil can be larger than 2 mm. Also, if the plasma heat load or sputtering is not excessive, as for example for operations in the range of several hundred watts, the plasma shield may be omitted. At the opposite extreme, for very high density plasmas, active cooling of the coil and plasma shield may be necessary. Also, depending on applications, the level of metal deposition on the ground plane and stiffeners may be unacceptable. In that case, the coil cross section may be changed from a rectangular shape to a chevron shape, so that the coil conductors themselves block line of sight paths through the coil. While more complex, this configuration will substantially reduce the level of metal deposition behind the coil In etch applications, the present invention results in a uniform, high etch rate at a reduced voltage. Other applications of the invention allow a pre-clean step to be performed in situ in an IPVD module.

The source can be used along with a main ICP source or may replace it completely. The source can be used in various process applications, in addition to those specifically described herein, that involve sputtering of metal atoms or ions.

These and other objectives and advantages of the present invention will be more readily apparent from the following detailed description.

DETAILED DESCRIPTION

Figure 1:
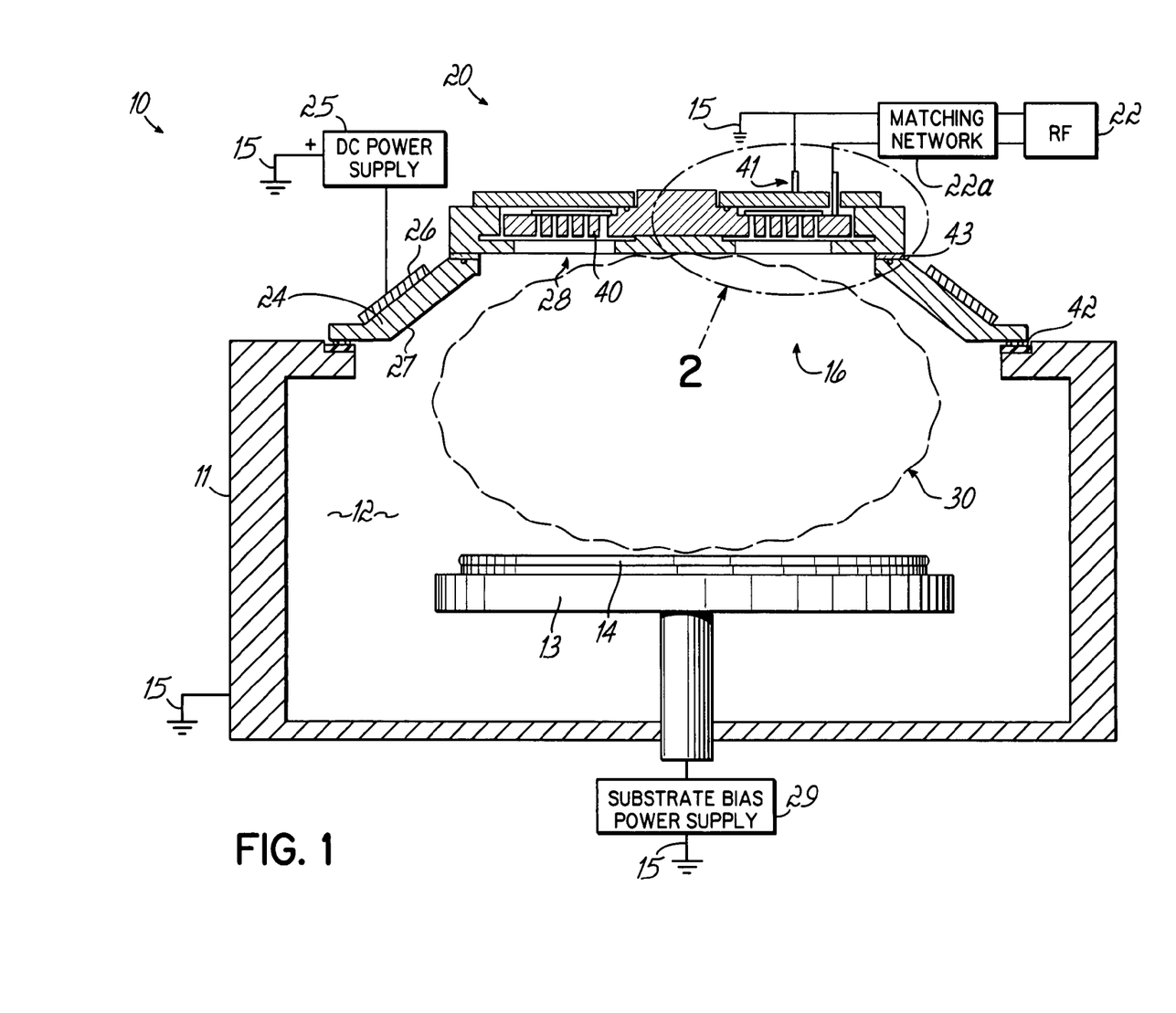
FIG. 1 is a cross-sectional diagram of an iPVD apparatus according to one embodiment of the present invention having a high-density plasma source opposite and facing the wafer.

FIG. 1 illustrates an iPVD apparatus 10 of a type described in U.S. Pat. Nos. 6,287,435 and 6,719,886. The apparatus 10 includes a vacuum processing chamber 12 enclosed by a grounded metal chamber wall 11. An upwardly facing wafer support 13 supports a semiconductor wafer 14 in the chamber 12 for processing. In a circular opening 16 in the upper surface of the chamber wall 11, is a coating material source that includes a frusto-conical sputtering target 24 formed of the material, typically a metal, with which surfaces on the wafer 14 are to be coated. A permanent magnet pack 26 lies behind the target 24 and provides a plasma confining static magnetic field over the sputtering surface 27 of the target 24. A DC power source 25 is connected between the target 24 and a system ground 15 to apply a negative DC sputtering potential to the target 24. An RF bias power supply 29 is connected between the substrate support 13 and the system ground 15.

In an opening 28 at the center of the target 24 is supported an inductively coupled plasma (ICP) source 20 that generates RF energy to support a high density plasma with a process volume 30 between the target 24 and the wafer 14 within the chamber 12. The ICP source 20 includes an RF power supply 22 that is connected through a matching network 22a between the system ground 15 and a lead 41 of an internal RF coil or antenna 40. The ICP source is sealed to the target 24, which in turn is sealed to the chamber wall 11, thereby forming a vacuum tight closure for the opening 16 in the chamber wall 11. Electrical insulators 32 and 33 respectively isolate the target 24 from the chamber wall 11 and the ICP source 20.

Figure 2:
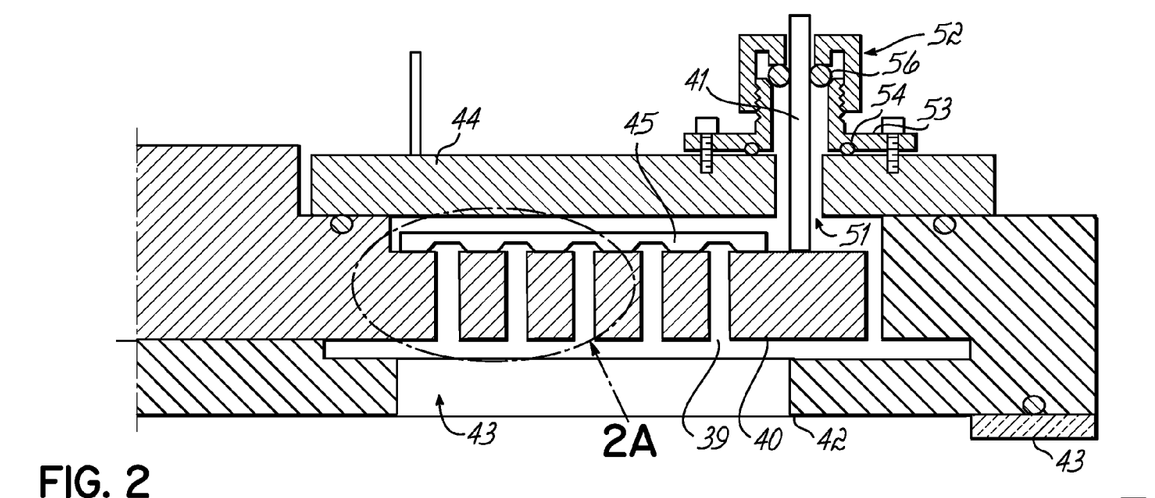
FIG. 2 is an enlarged view of the encircled portion of FIG. 1.

FIG. 2 is an enlarged cross-sectional view of a portion of the plasma source 20 according to an embodiment of the present invention. The plasma source 20 of this embodiment includes the internal coil 40, shielded by a plasma shield 42. The coil 40 and the shield 42 are dimensioned so that gaps around the coil 40 are sufficiently narrow to prevent the ignition of parasitic discharges around the RF coil 40. The plasma shield 42 is designed to withstand high temperatures and to absorb most of the plasma heat load. This feature eliminates the need to actively cool the RF coil. Such shield design includes forming the shield of sufficient mass of high thermal conductivity material to distribute and conduct heat away, while providing sufficient areas in contact with the heat sink of the chamber wall 11 to effectively remove the heat from the shield 42.

Figure 1A:
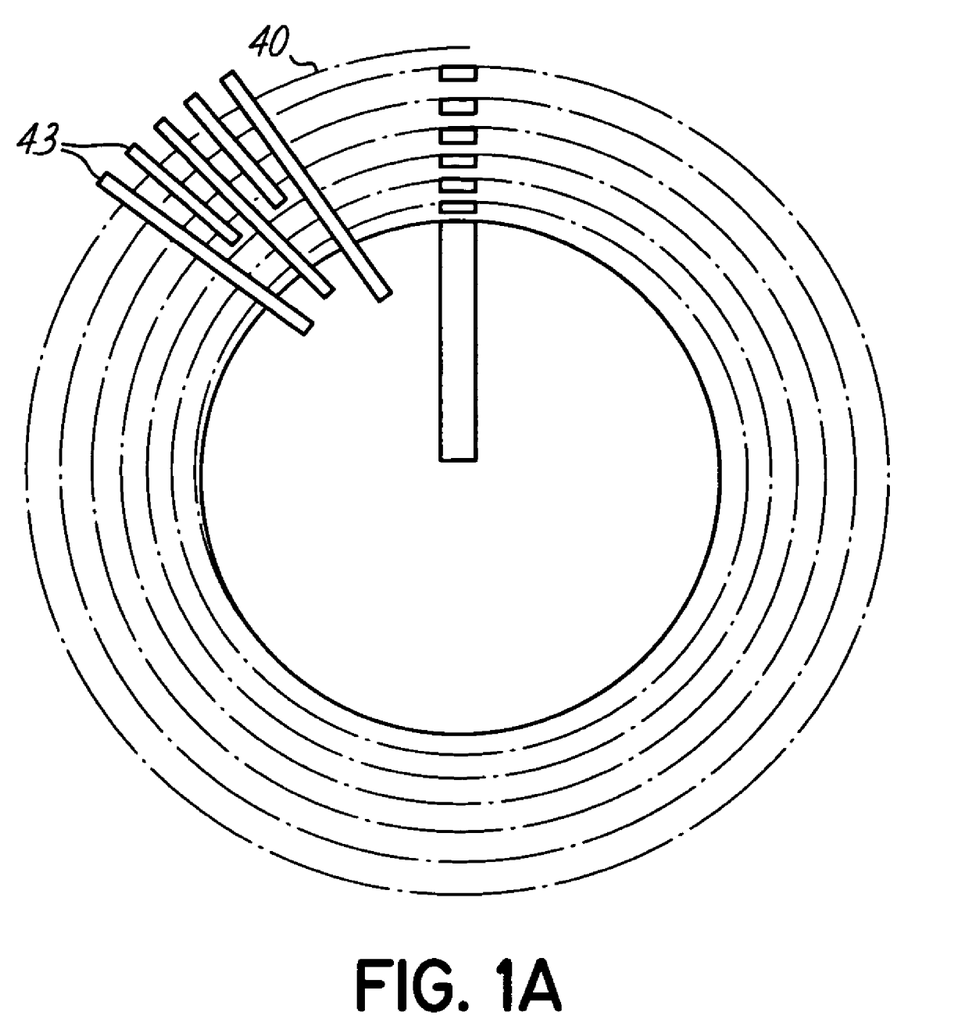
FIG. 1A is cross-sectional diagram illustrating shield slot and coil conductor relationships of the plasma source of FIG. 1.

FIG. 1A is a diagrammatic view of the bottom of the source 20 taken along line 1A-1A of FIG. 1 and shows the coil 40 having a generally spiral shape and the shield 42 having slots 43 in a generally radial direction around its circumference, generally perpendicular to the windings of the conductor of the coil 40. As shown in FIG. 2, behind the coil 40 is a backplate 44. The slots 43 facilitate RF transmission from the coil 40 through the shield 42 into the process volume 30 of the chamber 12. The cross section of the RF coil 40 is such the shapes of the spaces 39 between adjacent windings of the coil conductor reduce, although do not entirely eliminate, the passage of metal coating material from the target 24 onto the backplate 44. The shape of the RF coil is preserved by stiffeners 45 mounted on the side of the coil 40 that faces the backplate 44.

The plasma shield 42, in addition to absorbing most of the plasma heat load, allows only a non-negligible fraction of metal flux to deposit on the coil 40. Allowing some of the coating material to pass through the shield 42 simplifies the profile of the shield 42 and increases the RF transparency of the shield 42.

The backplate 44 is both RF grounded to the system ground 15 and thermally grounded to structure (not shown) supported by the chamber wall 11. The backplate 44 can sustain a substantially larger amount of metal deposition than could a dielectric window of the type provided between the coil and the shield when the coil is mounted external of the chamber 12.

Figure 2A:
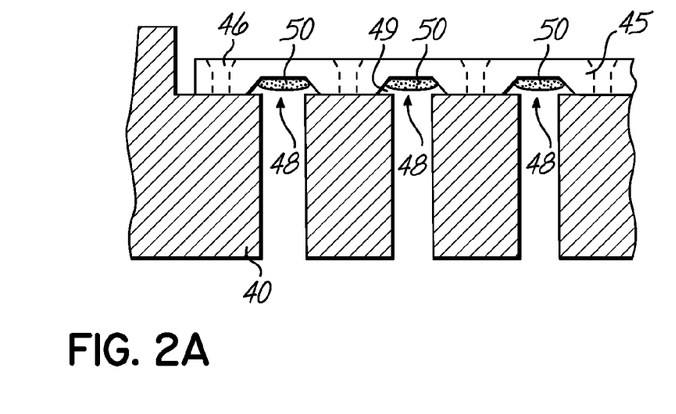
FIG. 2A is a further enlarged view of the encircled portion of FIG. 2.

The coil stiffeners 45 keep the coil 40 from sagging, which could cause it to come in contact with the plasma shield 42. To prevent that, several radial stiffening members 45 are employed, each made of a dielectric material and attached to the coil 40, for example by screws 46, as illustrated in FIG. 2A. These stiffeners 45 should not come into contact with the backplate 44 either. The backplate 44 may have grooves machined in locations corresponding to the stiffeners 45, in order to preserve a design spacing of 2 mm or less between the coil 40 and the backplate 44.

The surface of the stiffeners 45 that are facing the plasma can become coated with metal or other deposition material that passes from the process volume 30 through the slots 43 in the shield 42 and the spaces 39 between the conductors of the coil 40. Accordingly, the stiffeners 45 are profiled to prevent the formation of an electrically conductive path from one turn of the coil to the next. The profiling includes the formation of notches 48 in the stiffeners 45 that are wider than the spaces 39 between the conductors of the coil 40, to form undercuts 49 that are not exposed to deposition material and thus will remain free of conductive deposit formation. As a result, coating deposits 50 may form without making electrical contact with the coil 40.

Figure 3:
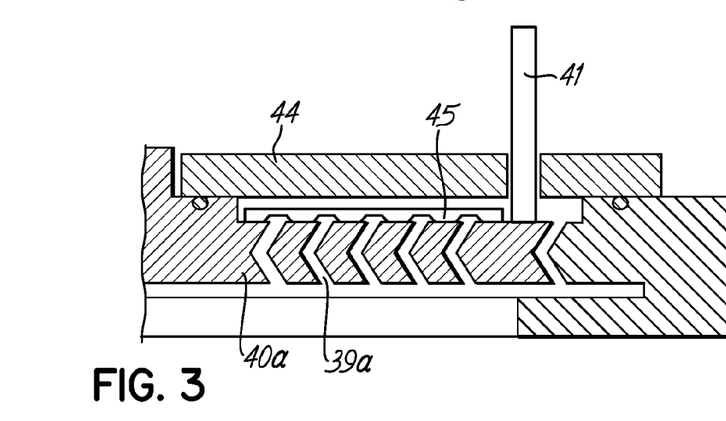
FIG. 3 is an alternative embodiment of the portion of the apparatus of FIG. 2A.

To further reduce the material that passes through the spaces 39 and deposits on the stiffeners 45, the coil 40 may be configured to block line-of-sight paths through the spaces 39, such as by providing chevron shaped spaces 39a as shown in the coil 40a of FIG. 3.

The RF feed 41 of the coil 40 passes through hole 51 in the backplate 44, out of electrical contact with the backplate 44. An electrically non-conductive, vacuum-tight feed seal assembly 52 is provided to seal and support the feed 41 at the hole 51, as illustrated in FIG. 2. The center of the coil 40 is thermally and electrically grounded to the backplate 44. The RF feed 41 is connected to the outer end of the coil 40.

The seal assembly 52 is a two-part sealing assembly that includes a base 53 that is bolted to the back-plate 44 with an O-ring seal 54 therebetween, and a cap 55, threaded to the top of the base 53, and shaped to lodge an O-ring 56 between it and the RF feed. The O-ring 56 is compressed between the top of the base 54 and the feed 41 by the threaded cap 55. Preferably, both the base 54 and the cap 55 are made of a high RF strength dielectric, such as DELRIN.

Since all surfaces will suffer some metal deposition, they should be conditioned to promote the adhesion of the deposited material. This is achieved by roughening them in a conventional manner. Further, to prevent the ignition of parasitic discharges between the turns of the coil 40, behind the coil 40, and between the coil 40 and the plasma shield 44, all the spacings should be less than some critical dimension, typically governed by the operating pressure and related to the mean free path of atoms of the process gas at that pressure. A typical value is 2 mm or less.

The conductor of the coil 40 should also have a cross section area sufficiently large to carry away the heat due to the RF losses on the coil 40. Such an area is in general about a one square centimeter cross-sectional area where the coil conductor is solid copper. The coil 40 has typically two to four turns, the optimal number of which may be determined by modeling. The number may vary based on system configuration and parameters.

The plasma shield 42 is thermally grounded both at the edge and the center. It should have good thermal conductivity and other thermal characteristics. For example, the shield 42 may be made of aluminum, several millimeters thick, or of stainless steel, also several millimeters thick. The coil 40 reduces metal deposition on the backplate 44, and also is configured to prevent plasma ignition between the turns of the coil 40, between the coil 40 and the back-plate 44, and between the coil 40 and plasma shield 42. A rectangular cross section for the coil 40 is preferred.

Slots 43 in the plasma shield 42, as illustrated in FIG. 1A, are of unequal length. At the outer radius, the slots 43 extend past the outermost winding of the coil 40 by at least twice the separation between the coil lower surface and the plasma facing shield surface. At the inner radius, the longest slots 43 again extend past the innermost coil winding by about the same distance.

The backplate 44 supports most of the atmospheric pressure against the vacuum within the chamber 12. It will thus have to be dimensioned accordingly to have sufficient strength to withstand the pressure without undue deformation.

The advantages of this invention as compared to external coil ICP sources in metal deposition applications include a less restrictive requirement on metal flux shielding that is necessary when the shield protects a dielectric window. The role of the shield 42, in the present embodiments, is to shield the coil 40 from the plasma heat load. Some metal is allowed to pass through the shield 42 and deposit on the coil 40. This leads to a thinner shield 42 with less complicated slots 43 than for shields in external coil configurations. Good RF transparency of the shield is a result of the much simpler shield shape. The coil 40 need not be actively cooled. In addition, it is not sputtered, and is thus not consumable, which would require its periodic replacement. It should, however, be cleaned from metal deposition from time to time. Since the coil 40 is enclosed in a small conductive space, its inductance is reduced by about 50% from that of most external coil designs, resulting in reduced coil current and voltage. This allows for the simplifying of some of the design and construction of the tuning network and RF connectors, and the trading off of the reduced coil voltage for a reduced coil current, which can be achieved by increasing the number of coil turns and thereby reducing the current through the coil. This in turn simplifies the design and construction of the tuning network 22a and RF connectors 41.

The source 20 has a much lower profile than the sources with external coils, particularly three-dimensional ICP coils. The coil 40 occupies a space comparable to that of the deposition baffle 42 or a ceramic window. It is optimally operated at a frequency of 450 kHz, although with careful design to limit the capacitive coupling between the turns of the coil, the coil and the shield, and the coil and the backplane, higher frequencies of up to about 1 MHz may be considered.

Figure 4:
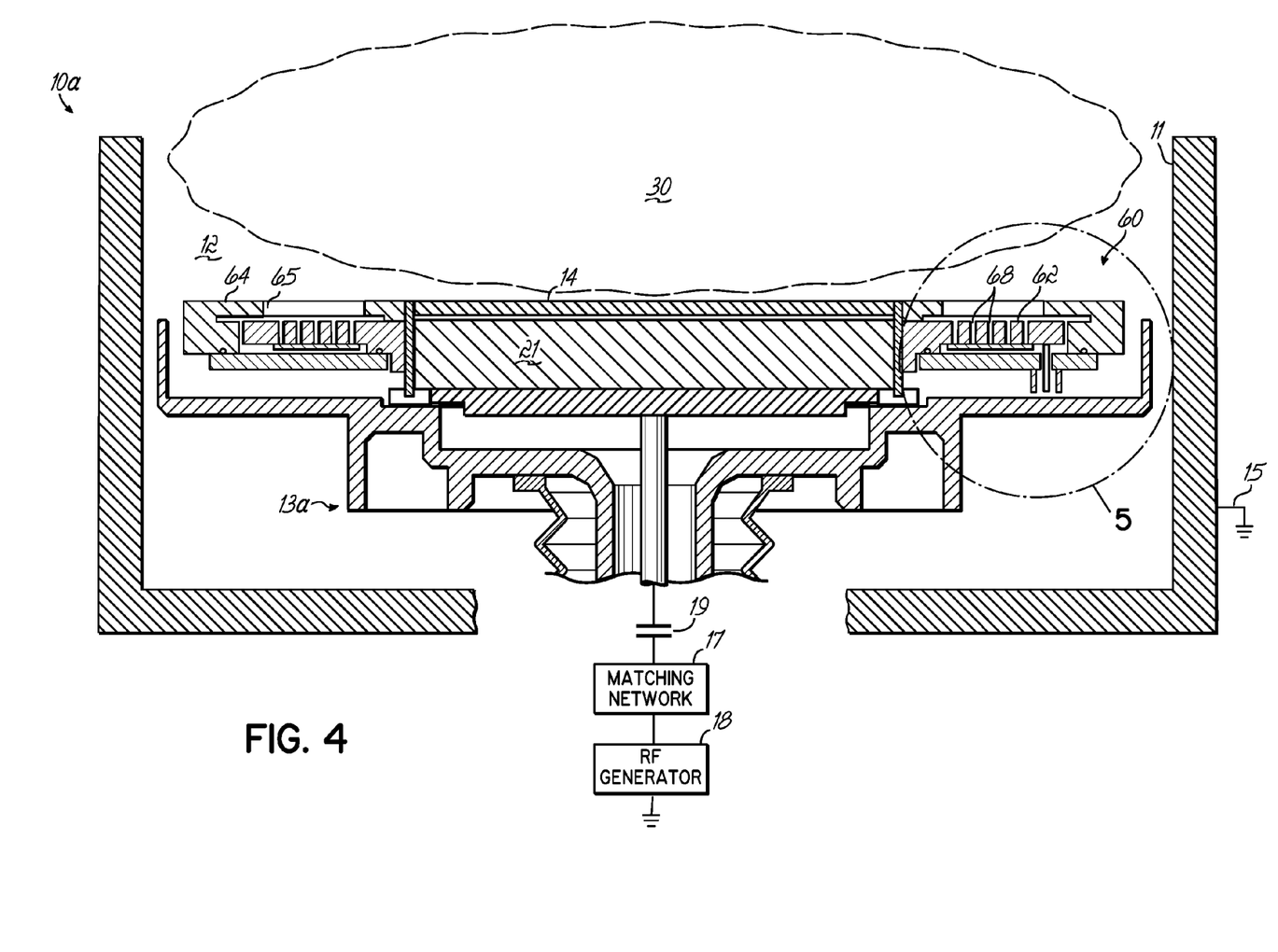
FIG. 4 is a cross-sectional diagram, similar to FIG. 1, of an iPVD apparatus according to an embodiment of the present invention having a wafer-level high-density plasma source.

The same principles as those described for the ICP source 20 above can be applied for a wafer level source 60 for providing a high-density plasma around the wafer 14 in a processing apparatus 10a, as illustrated in FIG. 4. A wafer level source 60 is disclosed in U.S. patent application Ser. No. 10/716,729. While most of the features of this source 60 are generally similar to the source 20, this source 60 is larger than in the case of the ICP source 20 described above. The source 60 includes an RF coil or antenna 62 that surrounds a wafer 14, around the periphery of a wafer support or chuck 13a. As illustrated in more detail in FIG. 5, the coil 62 has an RF feed 61 that is enclosed in a dedicated conduit 63 that connects to an RF generator (not shown) outside of the chamber 12. The conduit is provided to prevent the striking of a plasma along the RF feed within the vacuum of the chamber 12. Vacuum sealing considerations are less of an issue as with the source 20. Parts of the chuck 13a are RF hot, due to the application of RF bias through a matching network 17 and capacitor 19 from an RF bias generator 18. A shield 64 is typically provided having radial slots 65 therein. The shield 64 may also be RF hot or RF floating. The source 60 is, therefore, grounded separately from the wafer support assembly 13a.

Figures 5, 6:
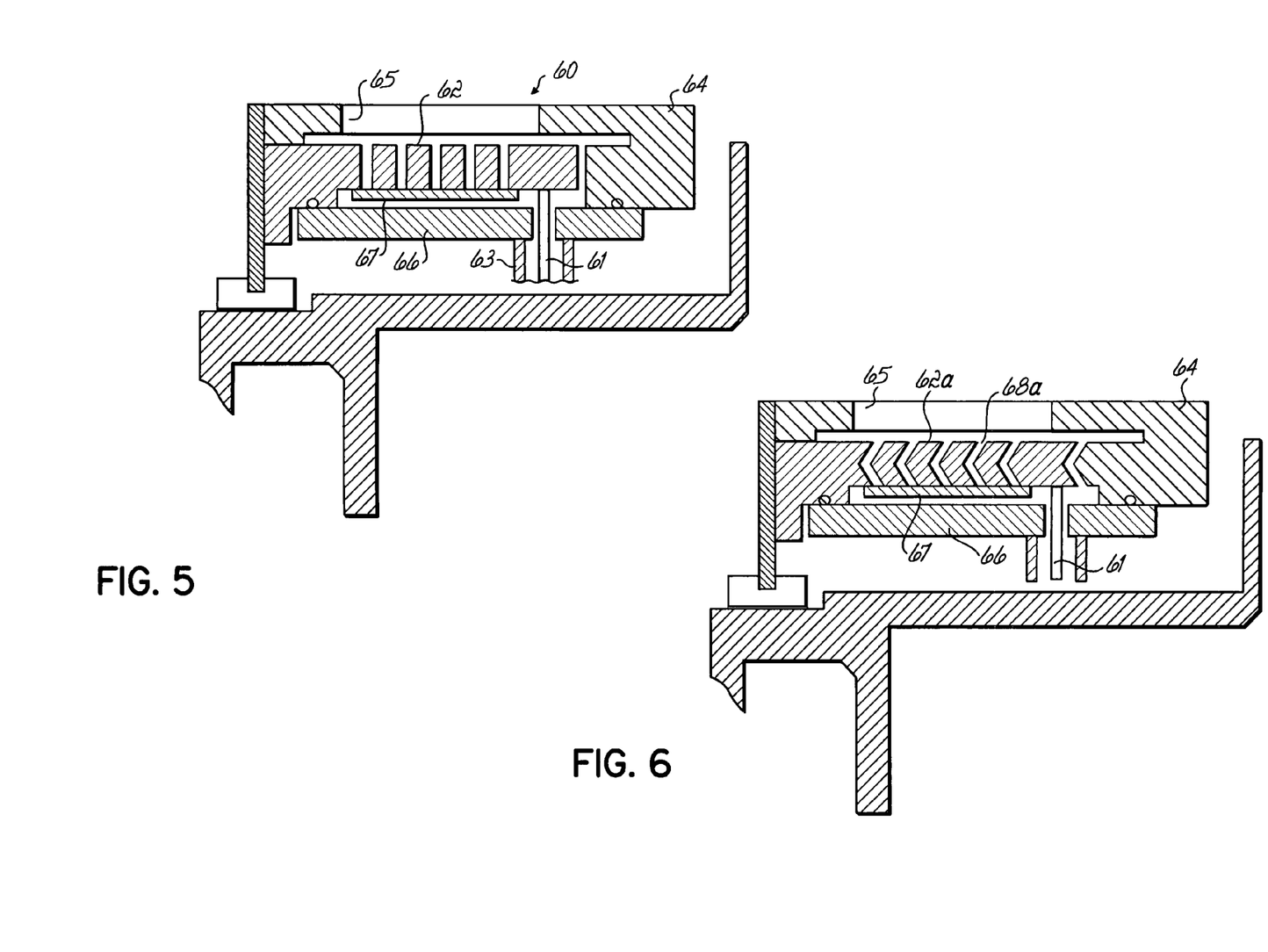
FIG. 5 is an enlarged view of the encircled portion of FIG. 4.
FIG. 6 is an alternative embodiment of the portion of the apparatus of FIG. 5.

The coil 62 otherwise is generally similar to the coil 40 described above. It is provided with a backing plate 66 spaced closely to the conductors of the coil 62 so as to prevent plasma ignition in this space. Coil stiffeners 67 are also provided, as with the stiffeners 45 described above. A narrow gap 68 is maintained between the windings of the coil 62, which, in the embodiment illustrated, is generally spiral, although other coil configurations may be used, depending on electrical parameters of the application.

Depending on the application, other considerations for the source 60 may be relevant. In exclusively low-pressure applications, for example, the spacings between the coil 62 and the shield 64, between the coil 62 and the backplate 66, and in the gaps 68 between windings of the coil, required to avoid plasma behind and around the coil 62 can be larger than 2 mm. Also, if the plasma heat load or sputtering of the coil 62 is not excessive, as for example for operations of several hundred watts, the plasma shield 64 may be omitted. On the opposite extreme, for very high density plasmas, active cooling of the coil 62 and the plasma shield 64 may be desirable.

Also, depending on applications, the level of metal deposition on the backing plate 66 and stiffeners 67 may be undesirably high. In that case, the coil cross section may be changed from a rectangular shape to a chevron shape, as illustrated with the coil 62a of FIG. 6. While more complex, such a chevron configuration reduces the level of metal deposition behind the coil 62.

The invention has been described in the context of exemplary embodiments. Those skilled in the art will appreciate that additions, deletions and modifications to the features described herein may be made without departing from the principles of the present invention. Accordingly, the following is claimed:

The invention claimed is:

1. A plasma processing apparatus comprising:
    a vacuum processing chamber having a vacuum throughout the vacuum processing chamber, a metal sputtering target and a substrate support therein, and a process volume therebetween, whereby the process volume is situated to receive a metal coating material sputtered from the metal sputtering target;
    an RF generator outside of the vacuum processing chamber;
    an internal RF antenna formed of a plurality of windings of an electrical conductor mounted within the vacuum processing chamber and positioned to produce an inductively coupled plasma in the process volume, the internal RF antenna having a back side, a front side facing the process volume, and an RF feed structure connecting the electrical conductor to the RF generator;
    a grounded electrically-conductive backplate parallel to, adjacent, and spaced from the back side of the internal RF antenna;
    an electrically non-conductive RF feed seal surrounding the RF feed structure and forming a vacuum seal between the RF feed structure and a wall of the vacuum processing chamber;
    an electrically-conductive plasma shield inside of the vacuum processing chamber that is parallel to and adjacent the front side of the internal RF antenna between the internal RF antenna and the process volume, the electrically-conductive plasma shield positioned such that the metal sputtering target being on the opposite side of the electrically-conductive plasma shield from the internal RF antenna, the electrically-conductive plasma shield having slots therein generally perpendicular to the electrical conductor of the internal RF antenna to facilitate substantial inductive coupling from the internal RF antenna through the electrically-conductive plasma shield while impeding capacitive coupling from the internal RF antenna into the process volume, the slots being positioned and configured to permit the passage of at least some metal coating material from the process volume to the internal RF antenna; and the internal RF antenna and the electrically-conductive plasma shield being positioned and dimensioned to provide spacing surrounding the electrical conductor and between the windings of the electrical conductor of less than 2 millimeters in the vacuum around the electrical conductor between the electrically-conductive plasma shield and the grounded electrically-conductive backplate, the spacing and the slots in the electrically-conductive plasma shield being at the vacuum and being sufficiently narrow to prevent the ignition of plasma or discharges around the internal RF antenna between the electrically-conductive shield and the grounded electrically-conductive backplate.

2. The apparatus of claim 1 wherein:

the electrically-conductive shield is formed to withstand temperatures encountered in a plasma processing and to sufficiently absorb a plasma heat load to render unnecessary actively cooling of the internal RF antenna.

3. The apparatus of claim 1 wherein:

the internal RF antenna and the electrically-conductive plasma shield are configured to avoid substantially all line-of-sight paths between the inductively coupled plasma and the grounded electrically-conductive backplate to substantially avoid deposition of the metal coating material from the process volume onto the internal RF antenna and the grounded electrically-conductive backplate.

4. The apparatus of claim 1 further comprising:

a plurality of dielectric stiffeners extending radially and attached to each of the plurality of windings of the electrical conductor of the internal RF antenna, wherein the plurality of dielectric stiffeners are located at a position in the vacuum processing chamber at which at least some metal coating material from the process volume that passes to the internal RF antenna can deposit onto the plurality of dielectric stiffeners and are spaced from the grounded electrically-conductive backplate by not more than approximately 2 mm, the plurality of dielectric stiffeners each having notches formed therein between the plurality of windings of the electrical conductor sufficiently recessed and undercut behind the electrical conductor so that deposits of the metal coating material from the inductively coupled plasma onto the plurality of dielectric stiffeners avoid formation of conductive paths between adjacent ones of the plurality of windings of the electrical conductor.

5. The apparatus of claim 1 wherein:

the electrically-conductive plasma shield is formed to withstand temperatures encountered in plasma processing and to sufficiently absorb plasma heat load to render unnecessary actively cooling the internal RF antenna;

the internal RF antenna and the electrically-conductive plasma shield are configured to avoid substantially all line-of-sight paths between the inductively coupled plasma and the grounded electrically-conductive backplate to substantially avoid deposition of the metal coating material from the process volume onto the internal RF antenna and the grounded electrically-conductive backplate; and a plurality of dielectric stiffeners extending radially and attached to each of the plurality of windings of the electrical conductor of the internal RF antenna, and spaced from the grounded electrically-conductive backplate by not more than approximately 2 mm, the plurality of dielectric stiffeners each having notches formed therein between the plurality of windings of the electrical conductor sufficiently recessed and undercut behind the electrical conductor so that deposits from the inductively coupled plasma onto the plurality of dielectric stiffeners avoid formation of conductive paths between adjacent ones of the plurality of windings of the electrical conductor.

6. A plasma processing apparatus comprising:

a vacuum processing chamber surrounded by a sealed chamber wall having a vacuum therein;

a metal sputtering target;

a substrate support having a substrate support surface facing the process volume;

a process volume between the metal sputtering target and the substrate support, wherein the process volume is situated to receive a metal coating material that is sputtered from the metal sputtering target during the operation of the apparatus;

an RF generator outside of the vacuum processing chamber;

an internal RF antenna formed of a plurality of windings of an electrical conductor mounted within the vacuum, the internal RF antenna being positioned to produce an inductively coupled plasma in the process volume, the internal RF antenna having a back side, a front side facing the substrate support, and an RF feed structure connecting the electrical conductor to the RF generator;

a grounded electrically-conductive backplate parallel to, adjacent, and spaced from the back side of the internal RF antenna, the grounded electrically-conductive backplate being located at a position in the vacuum processing chamber where at least some of the metal coating material from the process volume can pass to the grounded electrically-conductive backplate;

an electrically non-conductive RF feed seal surrounding the RF feed structure and forming a vacuum seal between the RF feed structure and the sealed chamber wall; and the internal RF antenna being spaced from adjacent components thereof and with respect to adjacent components of the apparatus within the vacuum processing chamber to prevent the ignition of plasma or discharges in a process gas at the vacuum at the back side of the internal RF antenna and between and around the plurality of windings of the electrical conductor;

the internal RF antenna is dimensioned such that gaps among adjacent components thereof and with respect to adjacent components of the apparatus within the vacuum processing chamber are two millimeters or less to prevent the ignition of plasma or discharges at the back side of the internal RF antenna and between the plurality of windings of the electrical conductor when RF energy is applied to the internal RF antenna; and an electrically-conductive plasma shield inside of the process volume that is parallel to and adjacent the front side of the internal RF antenna and that is positioned such that the metal sputtering target is on the opposite side of the electrically-conductive plasma shield from the internal RF antenna and with the process gas at the vacuum between the electrically-conductive plasma shield and the internal RF antenna, the electrically-conductive plasma shield being spaced sufficiently close to the internal RF antenna to prevent the ignition of plasma or discharges in the process gas between the electrically-conductive plasma shield and the front side of the internal RF antenna, the electrically-conductive plasma shield being configured to withstand high temperatures and to sufficiently absorb the plasma heat load without active cooling of the internal RF antenna and having slots therein that permit passage of the metal coating material from the process volume to the internal RF antenna, the slots being generally perpendicular to the electrical conductor of the internal RF antenna and dimensioned to prevent at least a portion of metal-flux from the process volume from depositing onto the internal RF antenna while allowing substantial inductive RF coupling from the internal RF antenna through the electrically-conductive plasma shield and into the process volume while impeding capacitive coupling from the internal RF antenna into the process volume.

7. The apparatus of claim 6 further comprising:
a plurality of dielectric stiffeners extending radially and attached to each of the plurality of windings of the electrical conductor of the internal RF antenna and spaced from the grounded electrically-conductive backplate by not more than approximately 2 mm, the plurality of dielectric stiffeners having notches formed therein between the plurality of windings of the electrical conductor configured to prevent the formation of a conductive path from adjacent ones of the plurality of windings of the electrical conductor by a buildup of deposited metal coating material onto the plurality of dielectric stiffeners.

8. The apparatus of claim 6 wherein:
the internal RF antenna has coil conductors configured to block line-of-sight paths through the internal RF antenna to substantially reduce the level of metal coating material deposition that would otherwise deposit onto the grounded electrically-conductive backplate.

* * * * *

UNITED STATES PATENT AND TRADEMARK OFFICE
CERTIFICATE OF CORRECTION

| | |
|---|---|
| PATENT NO. | : 7,691,243 B2 |
| APPLICATION NO. | : 10/873544 |
| DATED | : April 6, 2010 |
| INVENTOR(S) | : Mirko Vukovic |

It is certified that error appears in the above-identified patent and that said Letters Patent is hereby corrected as shown below:

Column 1

Line 6, remove the "," after the word "apparatus" and insert it after the word "and".

Column 3

Line 5, "behind the coil." should be --behind the coil;--.

Line 7, "backplate." should be --backplate;--.

Line 9, delete "that".

Line 10, "backplate." should be --backplate;--.

Line 12, "another." should be --another;--.

Line 15, delete "to".

Line 16, "from the coil." should be --from the coil;--.

Line 19, delete "which".

Line 20, "transparency." should be --transparency;--.

Line 20, "having" should be --has--.

Line 21, delete "the".

Line 21, "transmission." should be --transmission;--.

Line 21, after "vacuum seal", insert --is provided--.

Line 22, "feed." should be --feed;--.

Signed and Sealed this
Fourteenth Day of February, 2012

David J. Kappos
*Director of the United States Patent and Trademark Office*

Column 3

Line 22, after "assembly", insert --is provided--.

Line 24, "backplate." should be --backplate;--.

Line 24, "having" should be --has--.

Column 4

Line 34, after "FIG. 1A is", insert --a--.